US007616514B2

(12) United States Patent
Lee et al.

(10) Patent No.: US 7,616,514 B2
(45) Date of Patent: Nov. 10, 2009

(54) APPARATUS AND METHOD FOR GENERATING AN IMPRINT-STABILIZED REFERENCE VOLTAGE FOR USE IN A FERROELECTRIC MEMORY DEVICE

(75) Inventors: Kang-Woon Lee, Seoul (KR); Byung Jun Min, Yongin-si (KR); Han-Joo Lee, Seoul (KR); Byung-Gil Jeon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 151 days.

(21) Appl. No.: 11/212,311

(22) Filed: Aug. 26, 2005

(65) Prior Publication Data

US 2006/0077740 A1    Apr. 13, 2006

(30) Foreign Application Priority Data

Oct. 12, 2004    (KR) .................. 10-2004-0081168

(51) Int. Cl.
*G11C 7/14* (2006.01)
*G11C 7/02* (2006.01)

(52) U.S. Cl. ................ 365/210.1; 365/210.14; 365/145

(58) Field of Classification Search ........... 365/210, 365/145, 117, 210.1, 210.11, 210.14, 210.15, 365/190, 202, 207
See application file for complete search history.

(56) References Cited

U.S. PATENT DOCUMENTS

| 5,844,832 A | * | 12/1998 | Kim | ............................ 365/145 |
| 6,574,133 B2 | * | 6/2003 | Takashima | ................... 365/145 |
| 2004/0100813 A1 | * | 5/2004 | Ashikaga | ..................... 365/145 |

FOREIGN PATENT DOCUMENTS

JP    09231776 A    *    9/1997

* cited by examiner

*Primary Examiner*—J. H. Hur
*Assistant Examiner*—Douglas King
(74) *Attorney, Agent, or Firm*—F. Chau & Associates, LLC

(57) ABSTRACT

A reference voltage supply apparatus and a driving method thereof in a ferroelectric memory device provide a reference voltage stabilized against the imprint effect thus maintaining reading reliability of the device. In the reference voltage supply apparatus (e.g., using a non-switching capacitance of a ferroelectric capacitor), a reference cell is constructed of a ferroelectric capacitor and an access switch, and provides a reference voltage to read data from a memory cell. In an active mode, the reference cell stores data of a first logic state (e.g., corresponding to the non-switching capacitance of the ferroelectric capacitor), in the reference cell, and then supplies, as a reference voltage, the voltage corresponding to the data of the first logic state to a bit line; and in a stand-by mode, a reference voltage controller stores (writes) data of a second logic state (opposite to the first logic state), into the reference cell.

14 Claims, 10 Drawing Sheets

APPARATUS AND METHOD FOR GENERATING AN IMPRINT-STABILIZED REFERENCE VOLTAGE FOR USE IN A FERROELECTRIC MEMORY DEVICE

BACKGROUND OF THE INVENTION

1. Field of the Invention

The present invention relates to a ferroelectric memory, and more particularly, to a reference voltage supply apparatus for use in a ferroelectric memory device and a driving method thereof.

2. Description of the Related Art

Consumer and industrial demand for non-volatile memory devices is increasing. A ferroelectric random access memory (FRAM) using a ferroelectric thin film for a dielectric material, as in a DRAM (Dynamic Random Access Memory) memory cell's capacitor, is a non-volatile memory device, and has the merits of storing information in an unpowered state and of high-speed access, low power consumption and endurance against impact. A ferroelectric memory cell consists of a ferroelectric capacitor and an access switch (e.g., a field effect, FET or MOS transistor.). Its structure is similar to the storage cell of a DRAM. The difference is in the dielectric properties of the material between the capacitor's electrodes. This ferroelectric material has a high dielectric constant and can be polarized by an applied electric field. A residual polarization remains until it is coercively reversed by an opposite applied electric field. This makes the FRAM memory non-volatile. Note that "ferroelectric" material, despite its name, does not necessarily contain iron. The most well-known ferroelectric substance is BaTiO3, which does not contain iron.

Data is "read" out of a FRAM by applying an electric field to the capacitor. If this "switches" the cell into the opposite state (flipping over the electrical dipoles in the ferroelectric material) then more charge is moved during the read than if the cell was not flipped. This can be detected and amplified by sense amplifiers (S/A). Reading destroys the contents of a cell which must therefore be written back after a read. This is operation is similar to the precharge operation in DRAM, but it only needs to be done after a read rather than periodically as with DRAM refresh. Thus, FRAM devices are capable of overcoming the limitations of other memory devices, including the periodic refresh necessary for a DRAM (Dynamic Random Access Memory) device, by using a ferroelectric thin film for a dielectric film of a capacitor.

The use of FRAM memory devices is expected to increase, as a main memory (e.g., RAM, random access memory) in various kinds of electronic equipment having file storage and search functions such as portable computers, cellular phones and gaming machines etc., and for use as a removable recording medium (e.g., flash memory cards) for recording voice or images or video (e.g., music players, digital cameras, digital video recorders, etc.). Other devices potentially using FRAM memory includes office equipment (such as printers and copier machines), home appliances (microwaves ovens and washing machines, for instance) and industrial equipment (power meters).

When a voltage is applied to both ends of a ferroelectric capacitor, the ferroelectric material is polarized in the direction of the applied electric field. A switching threshold voltage at which a polarization state of the ferroelectric material is changed, is a coercive (forcing) voltage. In a FRAM device, a memory cell constructed of a ferroelectric capacitor and an access switch (transistor) stores data of logic state (e.g., '1' or '0') in the electric polarization state of a ferroelectric capacitor. To read data stored in a memory cell, a voltage is applied to generate a voltage difference between the electrodes of the ferroelectric capacitor, and the data state stored in the memory cell is sensed by the amount of charge excited (passed) to a bit line.

FIG. 1 illustrates a typical hysteresis curve for the ferroelectric material of the ferroelectric capacitor (e.g., see FIG. 2). FIG. 1 shows the changes of the level of polarization of ferroelectric film as the voltage is changed.

Referring to FIG. 1, when no electric field (e.g., a ground voltage Voss or 0V) is applied is applied across the ferroelectric material, polarization is not generated. When the voltage across the ferroelectric capacitor increases to a positive voltage (+If), polarization or a charge amount increases (e.g., from a zero or a negative charge at state point D) to a state point A of a positive polarization region. At the state point A, the polarization is generated in a positive direction, and a polarization level of the state point A has the maximum value represented as +Qs. Then, even though voltage across the capacitor falls to zero (ground voltage Vss), the polarization level does not fall to zero but remains at a state point B. The charge amount that ferroelectric material retains, a residual polarization, is represented as +Qr. Then, when voltage of both ends of the capacitor decreases to a negative voltage (−Vf), the polarization is changed to a state point C of a negative charge polarization region (from the state point B). At the state point C, the ferroelectric material is polarized to a maximum (negative) polarization, represented as −Qs, in a direction opposite to the polarization direction at state point A. Then, even though the voltage across the capacitor rises to zero (e.g., ground voltage Vss), the polarization level does not rise to zero but remains at a state point D. At this time, the residual (negative) polarization is represented as −Qr. When voltage applied across the capacitor increases again to a positive voltage (e.g., +Vf), the polarization of the ferroelectric material is again changed (back) to the state point A (from the state point D).

A ferroelectric capacitor is formed by inserting ferroelectric material as a dielectric the between two electrodes of the ferroelectric capacitor. When an applied voltage generates electric field across ferroelectric capacitor, then afterwards the applied voltage is removed, even though the electrodes are in a floating state a polarization (residual charge across the dielectric) is maintained. The residual charge of ferroelectric material is not lost naturally by leakage etc. If voltage is not applied in an opposite direction (e.g., so that polarization becomes forced to zero), a residual polarization charge and direction is maintained intact.

When a voltage is applied in a plus direction to the ferroelectric capacitor and is then removed, residual polarization of ferroelectric material becomes a state of +Qr. When a voltage is applied in a negative direction to the ferroelectric capacitor and is then removed, residual polarization of the ferroelectric material becomes a state of −Qr.

Herein, a residual polarization state of +Qr (at state point B) represents a binary logic state of data '0'; and a residual polarization state of −Qr, (at a state point D), represents a binary logic state of data '1'.

The charge amount in changing from the state point A to the state point B, (e.g., corresponding to the amount of non-switching capacitance Qnsw), is distinguishable from the charge amount in changing from the state point D to the state point A, namely, (corresponding to the amount of switching capacitance Qsw), thereby enabling the reading of data ('0' or '1') stored in the FRAM memory cell.

FIG. 2 illustrates a typical 1T-1C (one transistor, one capacitor) memory cell of a ferroelectric memory cell array according to the prior art.

With reference to FIG. 2, a ferroelectric memory cell consists of one switch (e.g., field effect access transistor M1) and one ferroelectric capacitor ($C_{FE}$). The access transistor M1 has two terminals, (a source terminal and a drain terminal), which are connected between one terminal of the ferroelectric capacitor $C_{FE}$ and a bit line BL. A gate (terminal) of the access transistor (switch) M1 is connected to (controlled by) a word line WL. One terminal of the ferroelectric capacitor $C_{FE}$ is thus switchably connected to the bit line through the access transistor M1, and another terminal of the ferroelectric capacitor $C_{FE}$ is conductively connected to a common plate line PL (e.g., together with a plurality of other ferroelectric capacitors of other memory cells).

In a typical read operation for data stored in a ferroelectric memory cell as described above, to sense and amplify a micro change of voltage excited (passed) to a bit line in a sense amplifier, a specific reference voltage generating apparatus is needed to generate a reference voltage having around medium voltage value between a bit line voltage value in reading data '1' and a bit line voltage value in reading data '0'.

There are two methods generating the reference voltage: using a paraelectric capacitor; and using a ferroelectric capacitor. In the method using a paraelectric capacitor having a small dielectric property, the on-chip area of the capacitor is relatively large and is thus inappropriate for a high-integration (high density) memory. The method using a ferroelectric capacitor is subdivided into two: that is, a method of limiting the size of the ferroelectric capacitor and using, as a reference voltage, a capacitance of a non-switching region of a hysteresis curve shown in FIG. 1, a Qnsw value; and a method of using both the switching capacitance and the non-switching capacitance and using a average value of the two values. In addition there is a method of using, as a reference value, a capacitance of a switching region of the hysteresis curve shown in FIG. 1, a Qsw value.

It is challenging to provide a stabilized reference voltage on-chip. This becomes a cause of lowering reliability of ferroelectric memory devices.

FIG. 3 illustrates a FRAM memory device (i.e., a ferroelectric memory device) that includes a reference voltage generating apparatus using a non-switching region capacitance of a conventional ferroelectric capacitor.

As shown in FIG. 3, a FRAM having a conventional reference voltage generating apparatus includes a main memory cell array having a plurality of ferroelectric memory cells MC, word line decoder and driver circuits 22a, 22b, 22c and 22d, a plate line driver circuit 24, a reference voltage supply apparatus 10 that has a reference cell array having a plurality of reference cells RC, and a sense amplifier S/A.

The main memory cell array is constructed of memory cells MC having the structure of the ferroelectric memory cell of FIG. 2. Thus, respective memory cells MC are constructed of one ferroelectric capacitor $C_{FE}$ and one access transistor M1. The memory cells MC are arrayed on intersections of word lines and bit lines. The access transistor (switch) in each memory cell MC is connected to one word line (e.g., SWL0, SWL1, SWL2, of SWL3). One terminal of the ferroelectric capacitor in each memory cell MC is connected to the plate line (e.g., PL0), and the other terminal thereof is connected to a bit line (e.g., BL0, BL1, BL2, BL3) through its respective access transistor (M1).

The word lines SWL0, SWL1, SWL2, SWL3 are respectively connected with word line decoder and driver circuits 22a, 22b, 22c and 22d. The plate line PL0 is connected to a plate line driver circuit 24 for providing a plate line enable signal to the plate line PL0 in response to a plate driver enable signal.

The reference voltage supply apparatus 10 includes a reference cell array (comprised of a plurality of reference cells RC, 10a), reference word line decoder and driver circuits 12a and 12b for providing a reference word line enable signal to respective reference word lines RSWL0 and RSWL1, and a reference plate line driver 14 for providing a reference plate line enable signal to a reference plate line RPL.

A reference cell RC of the reference cell array is constructed of one ferroelectric capacitor and one access transistor, and has the same as or similar structure as the structure of ferroelectric main memory cell MC.

A ferroelectric capacitor of a reference cell RC has a capacitance (e.g., area) larger than a ferroelectric capacitor of the memory cell MC. Reference cells RC having the same as or similar structure to the configuration of the main memory cells MC are arrayed at intersections of rows and columns, so as to obtain a reference cell array. The access transistors of respective reference cells RC are respectively connected to reference word lines RSWL0 and RSWL1. One terminal of a ferroelectric capacitor of each reference cell RC is connected to the reference plate line RPL. The other terminal of the ferroelectric capacitor of each reference cell RC is connected to a bit line (e.g., BL0, BL1, BL2, BL3) through its respective access transistor M1.

The reference word line decoder and driver circuits 12a and 12b are connected with the reference word lines RSWL0 and RSWL1, to provide a reference word line enable signal to the respective access transistors M1 of the reference cells RC via reference word lines RSWL0 and RSWL1.

The reference plate line driver circuit 14 provides a reference plate line enable signal having a predetermined level to the reference plate lines RPL in response to a reference plate line driver enable signal.

The sense amplifiers S/A are connected to corresponding pairs of bit lines (BL0, BL1, BL2 and BL3) that are commonly connected with the main memory cells MC and the reference cells RC, and compare a voltage level of main bit line BL connected to the main memory cell MC with a voltage level of a "sub-bit line" BLB (which may alternately be a predetermined one of bit lines BL0, BL1, BL2 and BL3) connected to the reference cell, and senses it, and then reads out data of a selected main memory cell.

Herewith, for an explanatory convenience, the bit line BL0 connected to the memory cell 20 is called a main bit line "BL", while bit line BL1 connected to a reference cell 10a is called a sub-bit line BLB. The main bit line BL refers to a bit line (e.g., BL0, BL1, BL2 or BL3) connected to a memory cell MC selected to be read, and the sub-bit line BLB indicates a bit line (e.g., BL0, BL1, BL2 or BL3) connected to a reference cell RC for providing a reference voltage corresponding to the selected (selected to be read) memory cell MC.

Additionally, transistors N1, N2, N3 and N4 may be configured to precharge the bit lines BL0, BL1, BL2 and BL3.

FIG. 4 is a timing diagram illustrating the timing of a read data operation of a main memory cell in the conventional ferroelectric memory device of FIG. 3.

A read operation for data stored in memory cell 20 of FIG. 3 connected to a bit line BL0 will be described section by section, as follows. Herein, for convenience, the bit line BL0 connected to the memory cell 20 is called a main bit line BL, and the bit line BL1 connected to reference cell 10a is called a sub-bit line BLB. The main bit line BL indicates the bit line connected to a memory cell MC selected for a current read operation, and the sub-bit line BLB indicates the bit line connected to a reference cell RC to provide a reference voltage corresponding to the selected memory cell MC. The different voltage level signals detectable on the main bit line and sub-bit line for two alternate cases (e.g., data '1' stored, and data '0' stored in memory cell 20) are depicted at the bottom of FIG. 4.

As shown in FIGS. 3 and 4, before a read operation starts, precharge signals BL_PR and RBL_PR of a main bit line BL (connected to a memory cell 20) and of a sub-bit line BLB (connected to a reference cell 10a) are enabled (active high) to precharge bit lines BL and BLB.

At section "I", when a chip selector signal CS is enabled (active high) and a read operation starts, main bit line BL and sub-bit line precharge signals BL_PR and RBL_PR are disabled. Simultaneously, the bit lines BL and BLB and the sense amplifier(s) S/A are electrically connected through switches (e.g., field effect transistors, FETS) by switch-control signals SA_PATH and RSA_PATH.

Next, a selected word line SWL0 and a corresponding reference word line RSWL1 are enabled (by a word line enable signal and a reference word line enable signal).

At section "II", when a plate line PL and a reference plate line RPL are enabled (to a voltage having a predetermined level), a voltage corresponding to data '1' or data '0' of a selected main memory cell 20 is excited (passed) to the main bit line BL, and a reference voltage is provided to the sub-bit line BLB connected to reference cell 10a.

At section "III", a sense amplifier S/A is driven by a sense amplifier enable signal SAEN, and data of the memory cell 20 is sensed and amplified based on the reference voltage.

At section "IV", before the data sensing operation of the sense amplifier S/A is completed, a sub-bit line precharge signal RBL_PR is enabled so as not to invert data of the reference cell 10a when data stored in the memory cell 20 is '0'.

At section "V", reference plate line RPL and the plate line PL0 are disabled, then word line SWL0 is disabled, and the data of the memory cell 20 returns to original data (e.g., the data value just sensed is written back into the memory cell MC). Then, a main bit line precharge signal BL_PR is enabled, and a sense amplifier enable signal SAEN is disabled. Next, a chip selector signal CS is disabled. A read operation of data stored in the memory cell 20 is thus performed.

FIG. 5 is a block diagram of ferroelectric memory device having a reference voltage supply apparatus that employs conventional non-switching capacitance and switching capacitance.

As shown in FIG. 5, a ferroelectric memory device having a conventional reference voltage generating apparatus 30 includes a main memory cell array having a plurality of ferroelectric memory cells MC, word line decoder and driver circuits 42a, 42b, 42c and 42d, a plate line driver circuit 44, a reference voltage supply apparatus 30 that has a reference cell array 30a having a plurality of reference cells (e.g., 31a and 33a), and sense amplifiers S/A. To simplify the illustration, the reference cells connected to the bit lines BL1 and BL3 are not shown in FIG. 5.

The main memory cell array is constructed of memory cells having the same structure as the memory cell of FIG. 2. Thus, respective memory cells MC are constructed of one ferroelectric capacitor $C_{FE}$ and one access switch (access transistor M1) and are arrayed on intersections of word lines SWL0, SWL1, SWL2 and SWL3 and bit lines BL0, BL1, BL2 and BL3. An access transistor (switch) in each memory cell MC is connected to one word line (e.g., SWL0, SWL1, SWL2, or SWL3). One terminal of the ferroelectric capacitor in each memory cell MC is connected to the plate line PL0, and the other end (terminal) thereof is connected to a bit line (e.g., BL0, BL1, BL2, or BL3) through the access transistor M1.

The word lines SWL0, SWL1, SWL2, and SWL3 are respectively connected to each of word line decoder and driver circuits 42a, 42b, 42c, and 42d. The plate line PL0 is connected to a plate line driver circuit 44 that provides a plate line enable signal to the plate line PL0 in response to a plate driver enable signal.

The reference voltage supply apparatus 30 includes a reference cell array, reference word line decoder and driver circuits (e.g., 32) for providing a reference word line enable signals to reference word lines (e.g., RSWL0), and a reference plate line driver 34 for providing a reference plate line enable signal to the reference plate line RPL. The reference voltage supply apparatus 30 also includes circuits for generating various controls signals RP, RS and EQ.

Reference cells 31a and 33a having the same as or similar structure to that of the main memory cell MC are arrayed at intersections of the rows and columns, to obtain the reference cell array.

The reference cell array 30a includes a first reference cell 33a and a second reference cell 31a. The first reference cell 33a is constructed of one ferroelectric capacitor $C_{REF0}$, one access switch (access transistor N33) and one control switch (control transistor N34), and stores/provides a voltage corresponding to a non-switching capacitance to bit line BL2 (when BL2 is employed as a sub-bit line). The second reference cell 31a is constructed of one ferroelectric capacitor $C_{REF1}$, one access switch (access transistor N31) and one control switch (control transistor N32), and provides a voltage corresponding to a switching capacitance to bit line BL0 (when BL0 is employed as a sub-bit line).

The ferroelectric capacitors $C_{REF1}$, and $C_{REF0}$ and the access transistors N31 and N33 constituting the first reference cell 33a and the second reference cell 31a have the same as or similar to the configuration of a ferroelectric main memory cell MC, and are connected to the same reference word line (RSWL0) and to a reference plate line RPL. Each access switch (transistor N31 and N33) is connected to a reference word line RSWL0. One end (terminal) of the ferroelectric capacitor of each reference cell RC is connected to a reference plate line RPL, and the other end(terminal) thereof is connected to a bit line (BL0 or BL2) through an access switch (e.g., access transistor N31 or N33).

The control switches (transistors N32 and N34) are controlled by control signal RP. The control switch (transistor N34) of the first reference cell 33a is connected between one terminal of the ferroelectric capacitor $C_{REF0}$ and a ground voltage. The control switch (transistor N32) of the second reference cell 31a is connected between one terminal of the ferroelectric capacitor $C_{REF1}$, and a line to which the control signal RS is applied.

The reference word line decoder and driver circuit 32 is connected to and drives a reference word line RSWL0, and provides a reference word line enable signal to the reference word line RSWL0.

The reference plate line driver circuit 34 provides reference plate line enable signals having a predetermined level to the reference plate lines RPL in response to a reference plate line driver enable signal.

The control signal EQ controls a equalization control switch (transistor N9), to obtain a mean (combined, averaged) value of the reference voltage(s) provided on the bit lines BL0 and BL2 in the reference cell array 30a and provides that averaged voltage to the sense amplifier(s) S/A. The sense amplifier can reliably discriminate between a "0" and "1"

voltage signal on the BL if a reference voltage, midway (averaged) between a "0" and a "1" signal, is provided for the sense amplifier.

The sense amplifiers S/A are connected corresponding to bit lines BL0, BL1, BL2 and BL3 that are commonly coupled with the main memory cells MC and with the reference cells (e.g., 31a and 33a), and compare a voltage level of the main bit line BL (connected to the main memory cell MC) with a voltage level of the sub-bit line BLB (connected to the reference cell), and sense it, and then read out the data of a selected main memory cell MC.

Additionally, transistors N5, N6, N7 and N8 may be configured to precharge the bit lines BL0, BL1, BL2 and BL3.

The reference cell connected to the BL0 has a ferroelectric capacitor storing a first logic state (e.g., "1"), and the reference cell connected to the BL2 has a ferroelectric capacitor storing a second logic state (e.g., "0"). Both capacitances of the ferroelectric capacitors of the reference cells may be identical in size to the capacitance of the memory cell capacitor. Each reference cell has an additional access switch (transistor) controlled by the control signal RP that is used to restore the original data state back into the reference cell after a read operation is complete.

FIG. 6 is a timing diagram illustrating the timing of a read operation for data stored in a main memory cell MC in the conventional ferroelectric memory device of FIG. 5.

By raising the RWL and the RPL, the first reference cell 31a generates voltage V1 on sub-bit line BL0 while the second reference cell 33a generates voltage V2 on sub-bit line BL2. Meanwhile, the accessed (selected) memory cells MC (e.g., 40) generate their own data on BL1 and BL3. Next, BL0 and BL2 are shorted together by raising EQ momentarily to share their charge. This results in a common reference voltage on both BL and BL that is equal to (V1+V2)/2, which is their average (mean) voltage. Then, the sense amplifiers are activated (by SAEN). At the end of a read operation, the first logic state (e.g., "1") is restored (rewritten) in the reference cell 31a and the second logic state (e.g., "0") is restored (rewritten) in the reference cell 33a, for the next read. This restoration of the original data of the reference cells is achieved by pulsing the RP and the RS as shown in FIG. 6.

A read operation for data stored in a memory cell 40 connected to bit line BL1 of FIG. 5 will be described section by section, as follows. For explanatory convenience, bit line BL1 connected to the memory cell 40 is called a main bit line BL, and bit lines BL0 and BL2 connected to a selected reference cell (e.g., 31a or 33a) (and to each other through control transistor N9) are called a sub-bit lines BLB. The main bit line BL indicates a bit line connected to a memory cell MC selected for a read operation, and the sub-bit line BLB indicates a bit line (or bit lines) connected to reference cells to provide a reference voltage corresponding to the selected memory cell MC.

As shown in FIGS. 6 and 5, before a read operation starts, precharge signal BL_PR (of a main bit line BL connected to a memory cell 40 and of a sub-bit line BLB connected to a reference cell 31a) is enabled to precharge bit lines BL and BLB (e.g., to the ground voltage).

At section "I", when a chip selector signal CS is enabled and a read operation starts, bit line precharge signal BL_PR is disabled. Simultaneously, the bit lines BL0, BL1 and BL2 are electrically connected to the sense amplifier S/A by switches operated (closed) by control signal SA_PATH.

Next, a word line SWL1 and a reference word line RSWL0 (selected by a word line enable signal and a reference word line enable signal, respectively) are enabled.

At section "II", when a plate line PL and a reference plate line RPL are enabled to a voltage having a predetermined level, a voltage Vx corresponding to data '1' or data '0' stored in the selected main memory cell 40 is excited (passed) to the main bit line BL, and an (averaged) reference voltage is provided to the sub-bit line BLB connected to the reference cell 31a. A reference voltage corresponding to a non-switching capacitance provided from the first reference cell 33a is provided to sub-bit line BL2, and a reference voltage corresponding to a switching capacitance provided from the second reference cell 31a is provided to sub-bit line BL0. When the two reference voltages are provided to a sub-bit lines BLB (e.g., bit lines BL2 and BL0), a control signal EQ is enabled, to operate (close) the control transistor N9 and so provide a mean (averaged) value of the two reference voltages provided on the bit lines BL0 and BL2, (to the sub-bit lines BLB, e.g., BL0 and BL2). Then, the control signal EQ is disabled.

At sections "III" and "IV", the sense amplifier S/A is driven by a sense amplifier enable signal SAEN, and the stored data of the memory cell 40 is sensed and amplified based on the reference voltage.

At section "V", the reference plate line RPL and the plate line PL0 are disabled, then word line SWL1 is disabled, and the data of the memory cell 40 contains stored data it contained prior to the read operation. Also, the reference word line RSWL0 is disabled and a control signal RP is enabled, to drive the control transistors N32 and N34. Thus, in the first reference cell 33a, data corresponding to non-switching capacitance is maintained, and in the second reference cell 31a, data corresponding to switching capacitance is maintained by an enabled control signal RS. Next, bit line precharge signal BL_PR is enabled, and the sense amplifier enable signal SAEN is disabled. Then, chip selector signal CS is disabled. Thereby a read operation of data stored in the memory cell 40 is performed.

In such a reference voltage supply apparatus described above it is important to provide a stabilized reference voltage. However, in the conventional reference voltage supply apparatus referred to in FIGS. 3 to 6, ferroelectric non-switching capacitance is used. In this case a polarization state is maintained in the reference cells for a long time, which causes an imprint effect in the reference cells.

The imprint effect denotes that in case a ferroelectric is maintained in one polarization state for a long time, a hysteresis curve shifts to one side along the voltage axis. The ferroelectric memory cell having the imprint effect has state points located differently from the initial state points before the imprint effect occurrence, by the shift, thus causing a reference voltage change of a reference cell. This reduces the reliability of the ferroelectric device in a read operation.

SUMMARY OF THE INVENTION

An exemplary embodiment of the invention provides a reference voltage supply apparatus for a semiconductor memory and a method of driving the same. The apparatus supplies a stabilized reference voltage. In the apparatus and method an imprint effect is prevented or is substantially reduced, thereby maintaining the reliability of the device in a read operation.

As described in greater detail below, according to an exemplary embodiment of the invention, in an active mode (e.g., while a chip select signal is enabled), data of a first logic state is stored in a reference cell for supplying a reference voltage corresponding to a non-switching capacitance, before a start of general read operation, and in a stand-by mode (e.g., when a chip select signal is disabled), data of a second (opposite)

logic state is stored, thereby preventing or substantially reducing imprint effect of a ferroelectric capacitor of reference cell with a supply of stabilized reference voltage and maintaining reliability of read operations of the device.

One aspect of the present invention provides an apparatus for providing a reference voltage for reading data stored in a ferroelectric memory cell, the apparatus comprising: a reference cell, including a ferroelectric capacitor and an access switch, for storing data of a first logic state as a reference voltage during an active mode; and a reference voltage controller for writing data of a second logic state opposite to the first logic state, into the reference cell, in a stand-by mode.

An embodiment of the apparatus provides a reference voltage by using a non-switching region capacitance of a ferroelectric capacitor to reliably read data of memory cells and comprises a reference cell including a ferroelectric capacitor and an access switch (e.g., access transistor); a reference word line for controlling the access switch (e.g., transistor) of the reference cell; a reference plate line connected to one terminal of the ferroelectric capacitor of the reference cell; a bit line to which a reference voltage corresponding to data of the reference cell is excited (passed); and a reference voltage controller for storing data of a first logic state corresponding to a non-switching region capacitance of the ferroelectric capacitor, in the reference cell, in an active mode, and then for storing data of a second logic state opposite to the first logic state, in the reference cell, in a stand-by mode.

The reference voltage controller includes a reference word line decoder and driver circuit for controlling the reference cell through the reference word line; and a reference plate line driver circuit for controlling the reference cell through the reference plate line. The ferroelectric capacitor of the reference cell is connected between the access switch (e.g., transistor) and the reference plate line. The access switch (transistor) may be connected between the ferroelectric capacitor and the bit line. The ferroelectric capacitor of the reference cell may have a capacitance having a value larger than the capacitor of the memory cell.

Another aspect of the invention provides a reference voltage supply apparatus (for providing a mean value of non-switching region capacitance and switching region capacitance of a ferroelectric capacitor as a reference voltage), to reliably read data of a memory cell. The apparatus comprises a reference cell that includes a first reference cell for providing a voltage corresponding to a non-switching capacitance as data of a first logic state, as a first reference voltage, and a second reference cell for storing data of a second logic state opposite to the first logic state and providing a voltage corresponding to a switching capacitance, as a second reference voltage; a reference word line for controlling access switches (e.g., access transistors) constituting the reference cell; a reference plate line connected to each one terminal of ferroelectric capacitors constituting the reference cell; bit lines to which the first and second reference voltages are excited (passed); and a reference voltage controller for storing the data of the first logic state in the first reference cell in an active mode, and then for providing a mean value of the first and second reference voltages as a reference voltage, and for storing the data of the second logic state in the first reference cell in a stand-by mode.

In other words, in an active mode, when data of the second logic state is stored in the second reference cell, data of the first logic state is stored at the first reference cell, and then (during a read operation in the active mode) a mean value of the first and second reference voltages is supplied as a reference voltage to the sense amplifiers S/A; and in a stand-by mode, data of the second logic state is stored in the first reference cell and data of first logic state is stored in the second reference cell.

The first reference cell at least includes one ferroelectric capacitor and one access switch (e.g., access transistor), and the second reference cell at least includes one ferroelectric capacitor and one access switch (e.g. access transistor).

According to a still another aspect of the invention, a method of driving a reference voltage supply apparatus that provides a reference voltage by using a non-switching region capacitance of a ferroelectric capacitor, to read data of a memory cell, comprises enabling a chip selector signal to perform an active mode; storing data of a first logic state (e.g., corresponding to a non-switching region capacitance), in a reference cell; supplying a voltage corresponding to the data of the first logic state, as a reference voltage; performing a stand-by mode by a disabled chip selector signal; and storing data of a second logic state (opposite to the first logic state), in the reference cell during the stand-by mode.

A ferroelectric capacitor of the reference cell may have a capacitance having larger than the capacitance of the ferroelectric capacitor of the memory cell.

According to a yet another aspect of the invention, a method of driving a reference voltage supply apparatus that provides a mean value of non-switching region capacitance and switching region capacitance of a ferroelectric capacitor, as a reference voltage, to read data of a memory cell, comprises entering an active mode (e.g., by enabling a chip selector signal); storing data of a first logic state in a first reference cell that provides a voltage (e.g., corresponding to a non-switching capacitance as data of a first logic state) as a first reference voltage; storing data of a second logic state (opposite to the first logic state) in a second reference cell that provides a voltage (e.g., corresponding to a switching capacitance as data of a second logic state) as a second reference voltage; supplying, as a reference voltage, the mean value of the first reference voltage from the first reference cell, and the second reference voltage from the second reference cell; performing a stand-by mode (e.g., by a disabled chip selector signal); and storing the data of second logic state opposite to the first logic state, in the first reference cell (and storing the data of first logic state, in the second reference cell).

Thus, the reliability of semiconductor devices can be improved and maintained through such a stabilized reference voltage.

BRIEF DESCRIPTION OF THE DRAWINGS

Exemplary embodiments of the present invention are more fully described below with reference to FIGS. 7 through 10. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. Exemplary embodiments of the invention are described with reference to the accompanying drawings, in which.

DETAILED DESCRIPTION OF EXEMPLARY EMBODIMENTS OF THE INVENTION

Figure 7:
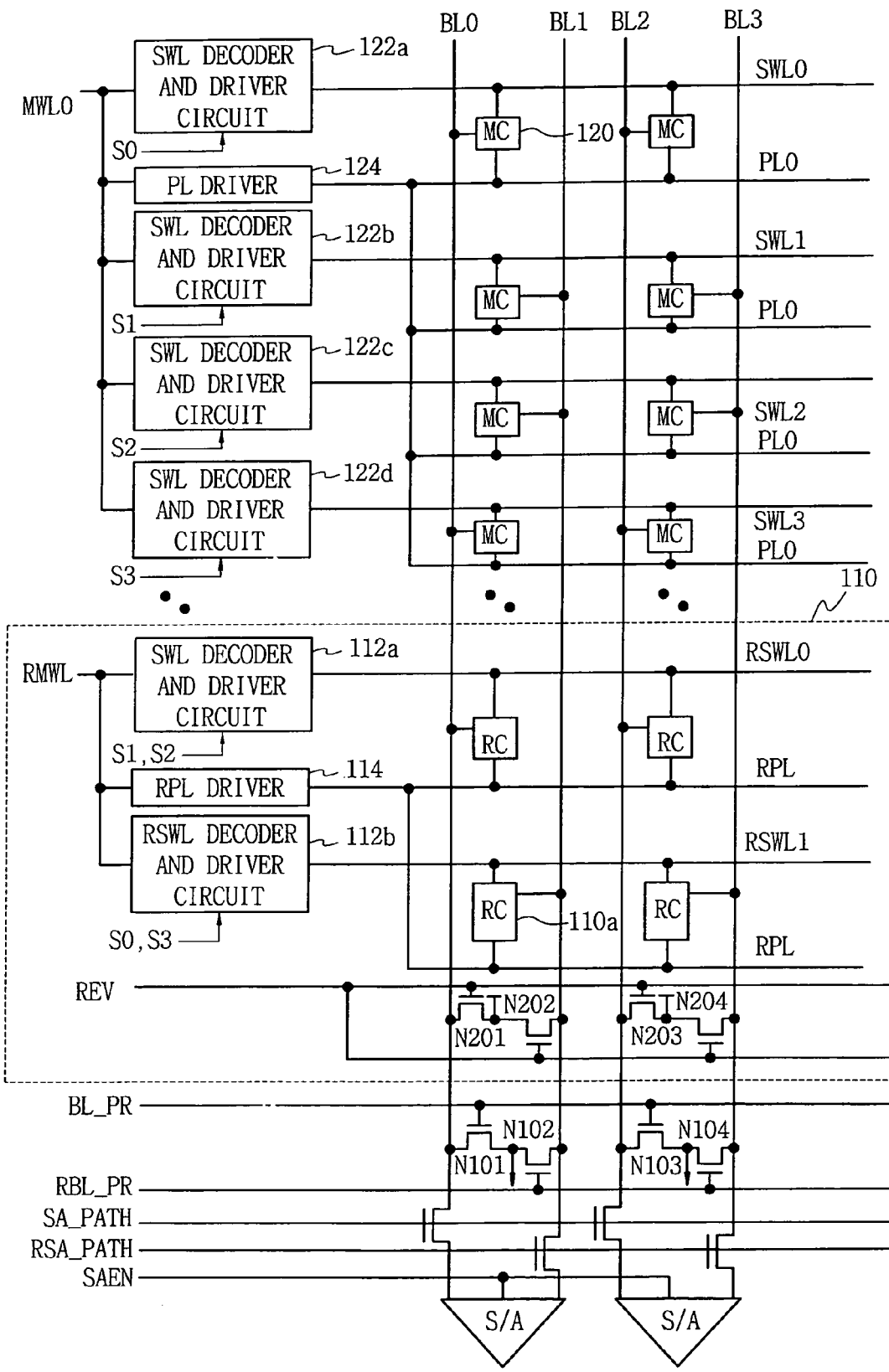
FIG. 7 is a block diagram of a ferroelectric memory device having a reference voltage supply apparatus that employs a non-switching capacitance according to an exemplary embodiment of the invention.

FIG. 7 is a block diagram of a ferroelectric memory device having a reference voltage supply apparatus that employs only a non-switching capacitance of a ferroelectric capacitor according to an exemplary embodiment of the invention.

Referring to FIG. 7, a ferroelectric memory device having a reference voltage supply apparatus includes a main memory cell array having a plurality (array) of ferroelectric memory cells MC, a reference voltage supply apparatus 110, and sense amplifiers S/A.

Figure 2:
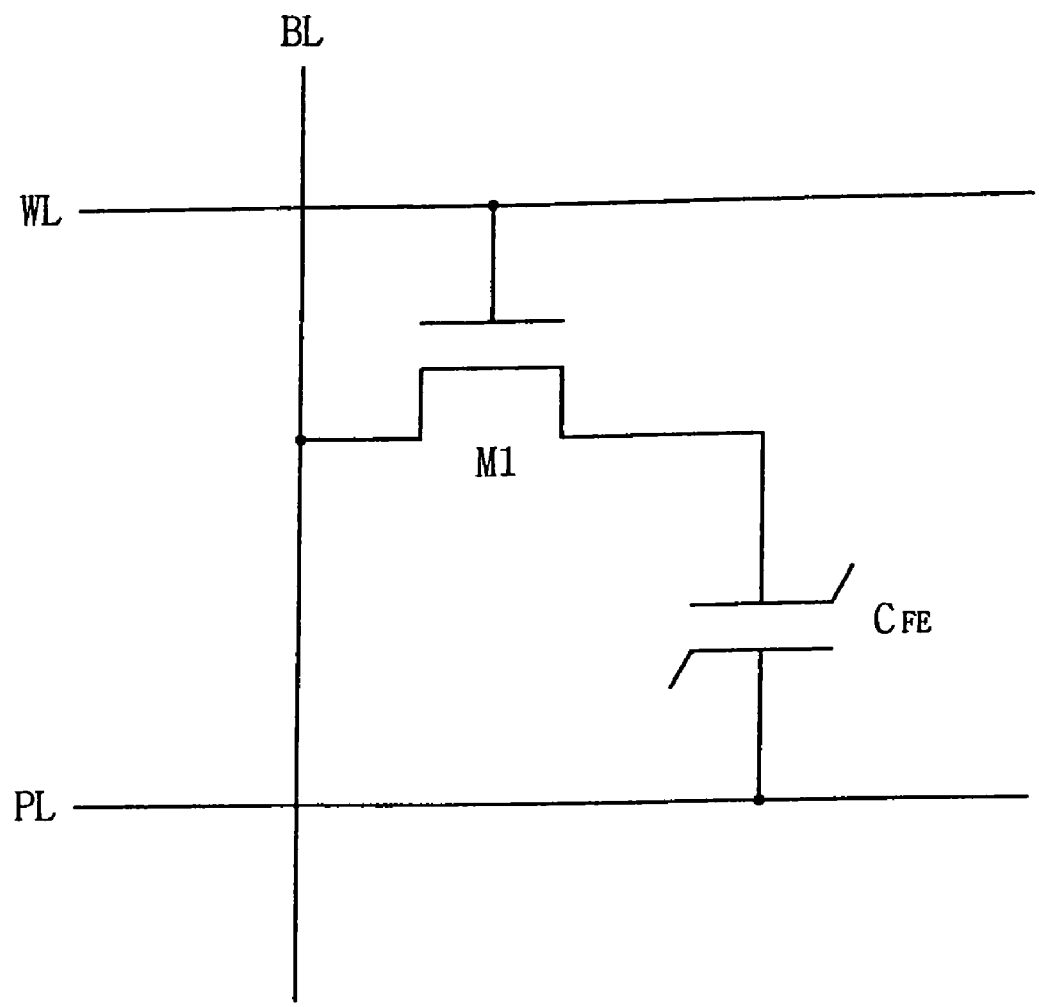
FIG. 2 is a circuit diagram illustrating a typical memory cell in a ferroelectric memory cell array according to the prior art.
Figure 3:
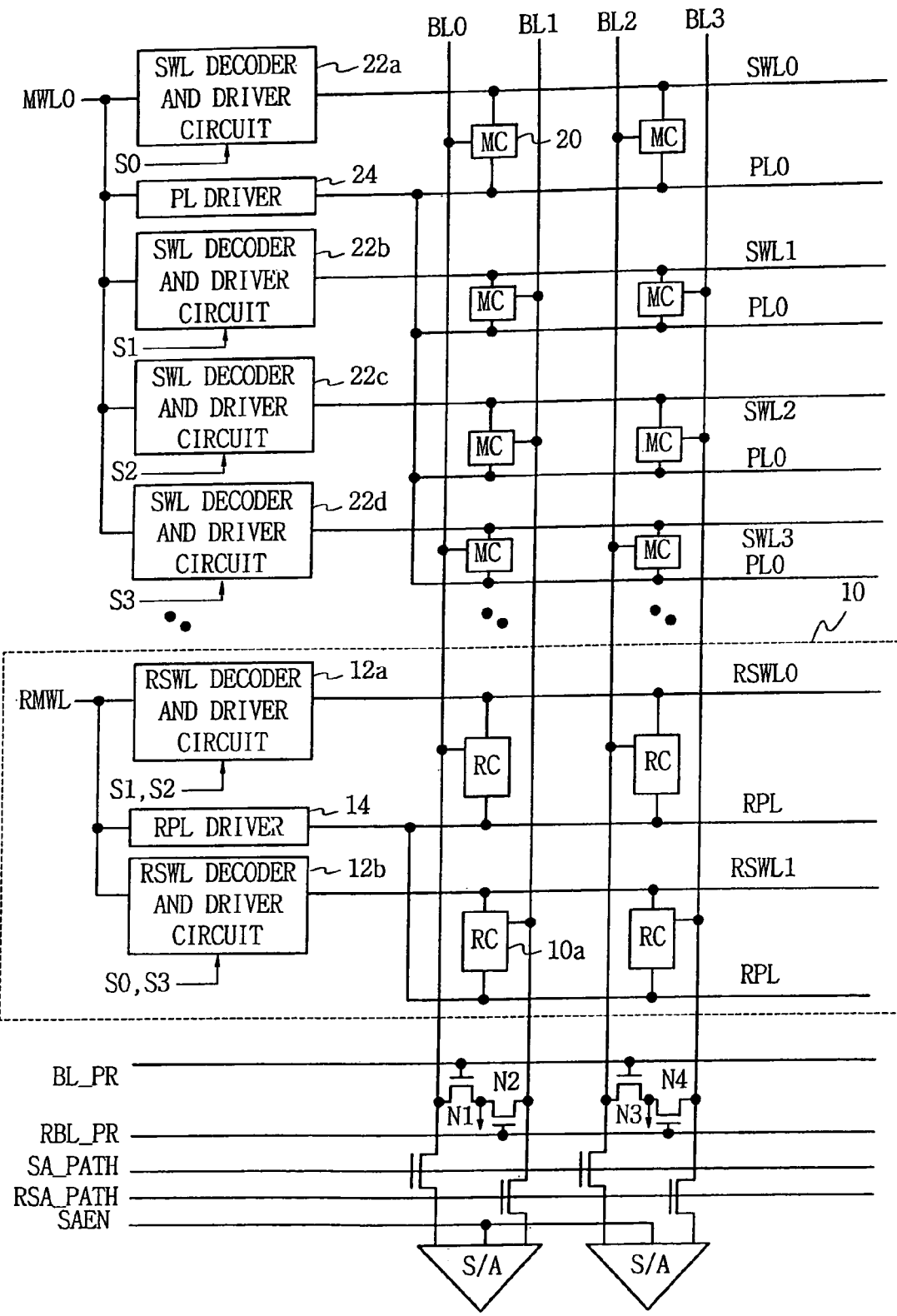
FIG. 3 is a block diagram of a ferroelectric memory device having a reference voltage supply apparatus that employs a non-switching capacitance according to the prior art.
Figure 4:
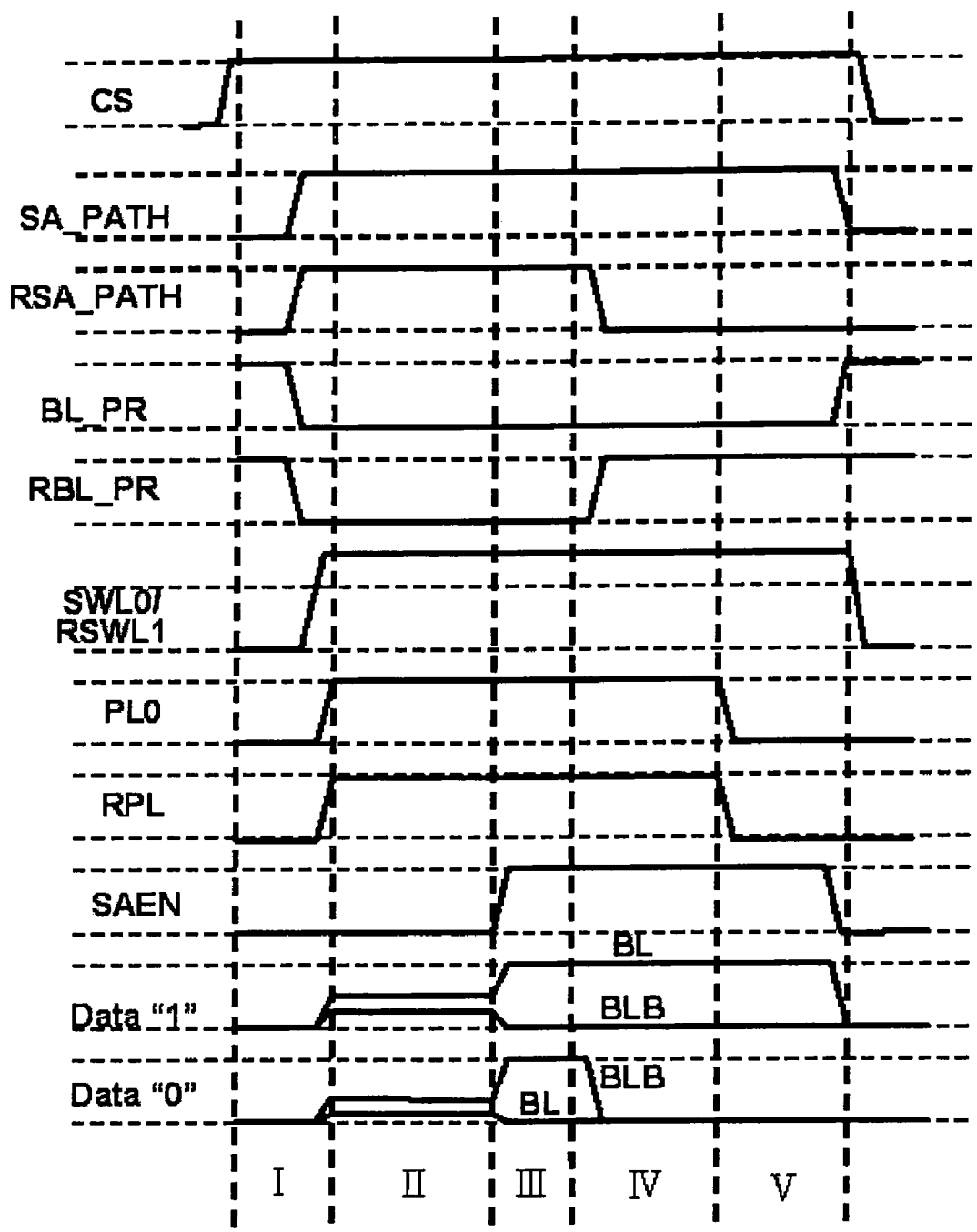
FIG. 4 is a timing diagram illustrating a read operation of a memory cell in the device of FIG. 3.

The main memory cell array is constructed of memory cells having the structure described in FIG. 2. Thus, the memory cells MC are respectively constructed of one ferroelectric capacitor and one access switch (e.g., access transistor) and are arrayed at intersections of rows and columns. One word line SWL0, SWL1, SWL2 or SWL3 is connected to the gate of the access switch (transistor) of each memory cell MC. One terminal of the ferroelectric capacitor of each memory cell MC is connected to a plate line PL0, and another terminal of the ferroelectric capacitor of each memory cell is switchably connected to a bit line (BL0, BL1, BL2, or BL3) through the respective access transistor.

The word lines SWL0, SWL1, SWL2 and SWL3 are controlled by respective word line decoder and driver circuits 122a, 122b, 122c and 122d which detect word line selection signals S0, S1, S2 and S3 for enabling the respective word lines. The word line decoder and driver circuits 122a, 122b, 122c and 122d receive the word line selection signals S0, S1, S2 and S3 through a main word line signal MWL0. The plate line driver circuit 124 provides a plate line voltage to the plate line PL0 in response to a plate enable signal.

The reference voltage supply apparatus 110 includes a reference cell array, reference word line decoder and driver circuits 112a and 112b (as reference voltage controllers), a reference plate line driver circuit 114, and control switches (transistors N201, N202, N203 and N204) that respond to a control signal REV, to connect the bit lines BL0, BL1, BL2, and BL3 to a predetermined voltage (e.g., supply voltage).

Reference cells RC (e.g., 110a) constituting the reference cell array are respectively constructed of one ferroelectric capacitor and one access switch (transistor), and have a structure the same as or similar to the structure of ferroelectric main memory cell MC. The reference cell RC may be configured with an additional control transistor, or may be configured in various other manners.

A ferroelectric capacitor of a reference cell RC (e.g., 110a) has a capacitance larger than the capacitance of the ferroelectric capacitor of a main memory cell MC (e.g., 120).

The reference cell array is constructed of reference cells RC that have a configuration the same as or similar to the configuration of the ferroelectric main memory cell MC and are arrayed at intersections of rows and columns. The gate of the access switch (e.g., access transistor) of each reference cell is connected to one of the reference word lines RSWL0 or RSWL1. One terminal of the ferroelectric capacitor of each reference cell is connected to the reference plate line RPL, and another terminal thereof is connected to a bit line (e.g., BL0, BL1, BL2, BL3) through the respective access switch (transistor) of the reference cell.

In the reference voltage controller, data of a first logic state (e.g., '0'), corresponding to a capacitance of non-switching region of the ferroelectric capacitor is stored in an active mode, and then a voltage corresponding to the data of the first logic state is supplied as a reference voltage; and in a stand-by mode, a voltage corresponding to the data of a second logic state (e.g., '1') opposite to the first logic state, is stored at the reference cell.

The reference word line decoder and driver circuits 112a and 112b are connected to drive the selected reference word line (e.g., RSWL0 or RSWL1), in response to a reference main word line signal RMWL and a word line selection signal S0, S1, S2 or S3. For example, when the reference main word line signal RMWL is applied in "H" and a word line selection signal S0, S3 is selected, the reference word line decoder and driver circuit 112b enables reference word line RSWL1.

The reference plate line driver circuit 114 provides a reference plate line voltage to the reference plate line RPL in response to a reference plate line enable signal.

The control transistors N201, N202, N203 and N204 when activated, (closed and conducting) by a control signal REV, pull up the bit lines to a supply voltage to store data of second logic state (e.g., '1') in the reference cell in a stand-by mode.

The sense amplifiers S/A are switchably connected to corresponding bit lines BL0, BL1, BL2 and BL3 (which are commonly connected with the main memory cells MC and the reference cells RC). The sense amplifiers S/A compare a (main) bit line voltage level connected to the main memory cell MC with a sub-bit line voltage level connected to the reference cell, and sense and read out data of the selected main memory cell. The sense amplifiers S/A are conductively connected (e.g., by switches, e.g., NMOS transistors) with the bit lines in response to a sense amplifier path signal SA_PATH or a complementary sense amplifier path signal RSA_PATH.

Additionally, switches (e.g., transistors) N101, N102, N103 and N104 are for precharging selected ones of the bit lines BL0, BL1, BL2 and BL3 (e.g., to a ground voltage) in response to bit line precharge signals BL_PR and RBL_PR.

Figure 8:
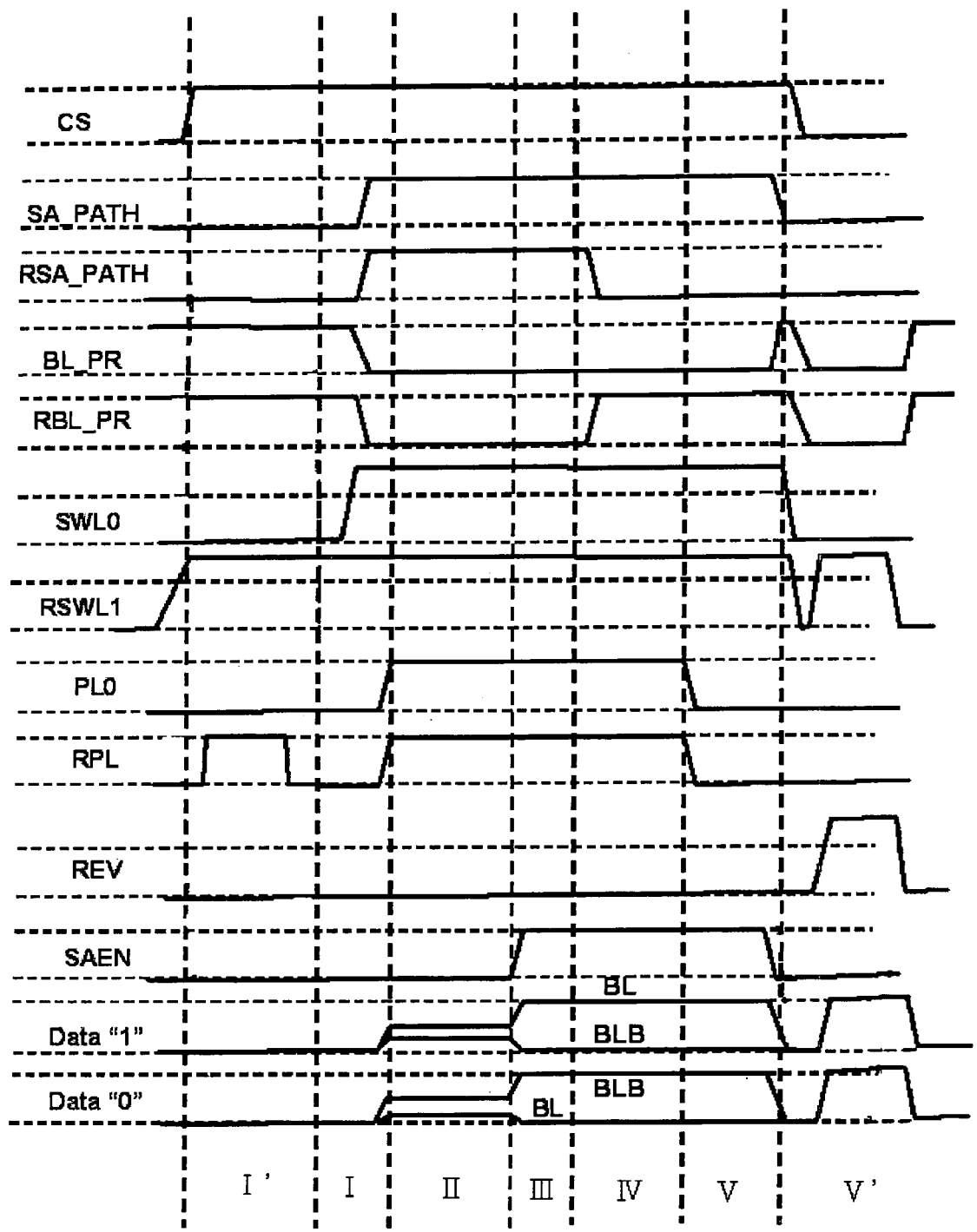
FIG. 8 is a timing diagram illustrating the timing of read operations of the device of in FIG. 7.

FIG. 8 is a timing diagram illustrating the timing of signals during a read operation of the ferroelectric memory device of FIG. 7.

Reading data stored in a memory cell 120 connected to the bit line BL0 of FIG. 7 will be described section by section, as follows. For an explanatory convenience, the bit line BL0 connected to the memory cell 120 is called a main bit line BL, and a bit line BL1 connected to a reference cell 110a is called a sub-bit line BLB. The main bit line BL indicates a bit line connected to a memory cell MC selected to be read, and the sub-bit line BLB indicates a bit line connected to a reference cell RC for providing a reference voltage corresponding to the selected (selected to be read) memory cell MC.

As shown in FIGS. 7 and 8, in a stand-by mode (at section I') before the enabling of a chip selector signal CS, a precharge signal BL_PR of the main bit line BL connected to memory cell 120 and the sub-bit line BLB connected to a reference cell 110a is enabled to precharge the bit lines BL and BLB.

At section I', when the chip selector signal CS is enabled, an active mode starts to store data of a first logic state in the reference cell 110a. First, reference word line RSWL1 is enabled to select a reference cell 110a and the main bit line BL and the sub-bit line BLB are precharged; a reference plate line is enabled and after a lapse of predetermined time then disabled, thereby storing data of the first logic state in the reference cell 110a.

The storing data of the first logic state in the reference cell can be performed by various other methods, such as applying a pulse to a bit line, etc. Further, in section I' the storage of data of the first logic state in the reference cell can be performed once only when a selected memory block of a reference cell array is changed.

At section "I", precharge signals BL_PR and RBL_PR of bit line BL and sub-bit line BLB are disabled. Simultaneously, the main sense amplifier path signal and sub-sense amplifier path signal, SA_PATH and RSA_PATH, are enabled, and the bit lines BL and BLB and the sense amplifier S/A are thus electrically connected. A main word line signal MWL0 and a word line selection signal S0 are enabled and applied, thus a word line SWL0 (connected to memory cell MC 120) is selected and enabled by word line decoder and driver circuit 122a. A reference word line decoder and driver circuit 112b is selected (activated) by the word line selection signal S0 and reference word line RSWL1.

At section "II", a plate line PL0 and a reference plate line RPL are enabled at a predetermined voltage. The level of reference voltage passed from the reference cell 110a can be controlled by controlling a voltage level of the reference plate line RPL.

A voltage as data "1" or data "0" corresponding to data stored in the main memory cell 120 selected hereafter is passed to the main bit line BL, and reference voltage is provided to the sub-bit line BLB connected to reference cell 110a. The reference voltage is a voltage corresponding to data of first logic state previously stored in the reference cell 100a.

The reference voltage may be determined as about the middle (average) value of voltages corresponding to a data "0" and "1" stored in the memory cell 120, which can be obtained by controlling a voltage level of the reference plate line RPL or by various other methods. The capacitance value of ferroelectric capacitor of the reference cell 110a is larger than a capacitance value of ferroelectric capacitor of a memory cell 120.

At a section "III", a voltage difference of bit lines BL0 and BL1 is sensed and amplified by the sense amplifier S/A in response to a sense amplifier enable signal SAEN.

When data "0" is sensed by an amplification reaction of the sense amplifier S/A, voltage of the main bit line BL becomes a ground voltage, and voltage of the sub-bit line BLB rises to the level of power supply voltage. When data "1" is sensed, voltage of the main bit line BL rises to the voltage level of power supply voltage, and the voltage of the sub-bit line BLB falls to the voltage level of a ground voltage.

At section "IV", a sub-sense amplifier path signal RSA_PATH is disabled to cut off the sense amplifier from the sub-bit line BLB, and a sub-bit line precharge signal RBL_PR is enabled to ground the sub-bit line BLB (e.g., through control switch N102), thereby preventing an inversion of data at a selected reference cell 110a.

At section "V", the reference plate line RPL and the plate line PL0 are disabled, then word line SWL0 is disabled, and so data of the memory cell 120 returns to the original data. Further, reference word line RSWL1 is disabled. A main bit line precharge signal BL_PR is enabled and a sense amplifier enable signal SAEN is disabled. Then, a chip selector signal CS is disabled. Whereby operation of the active mode is performed. When the chip selector signal is disabled, a stand-by mode starts.

When the stand-by mode starts, the main bit line precharge signal BL_PR and sub-bit precharge signal RBL_PR are again enabled, then reference word line RSWL1 is enabled. Next, when a control signal REV is enabled and control transistors N201, N202, N203 and N204 operate, and so the voltage level of the main bit line BL and the sub-bit line BLB becomes the level of the power supply voltage. Thus, data of a second logic state opposite to the first logic state is stored in the reference cell 110a.

In this state, after the lapse of predetermined time, the control signal REV is disabled and the main bit line precharge signal BL_PR and the sub-bit line precharge signal RBL_PR are again disabled.

Whereby the read operation of semiconductor memory device of FIG. 7 is completed. In the reference voltage supply apparatus of the semiconductor memory device described above a polarization state of ferroelectric capacitor of reference cell is prevented from being maintained for a long time (e.g., during a plurality of read operations), thus preventing or substantially reducing an imprint effect of the ferroelectric capacitors of the reference cells and providing a stabilized reference voltage.

When (during another read operation) a word line selection signal S1 instead of a word line selection signal S0 is selected, bit line BL1 becomes the main bit line BL, and bit line BL0 becomes the sub-bit line BLB.

Figure 9:
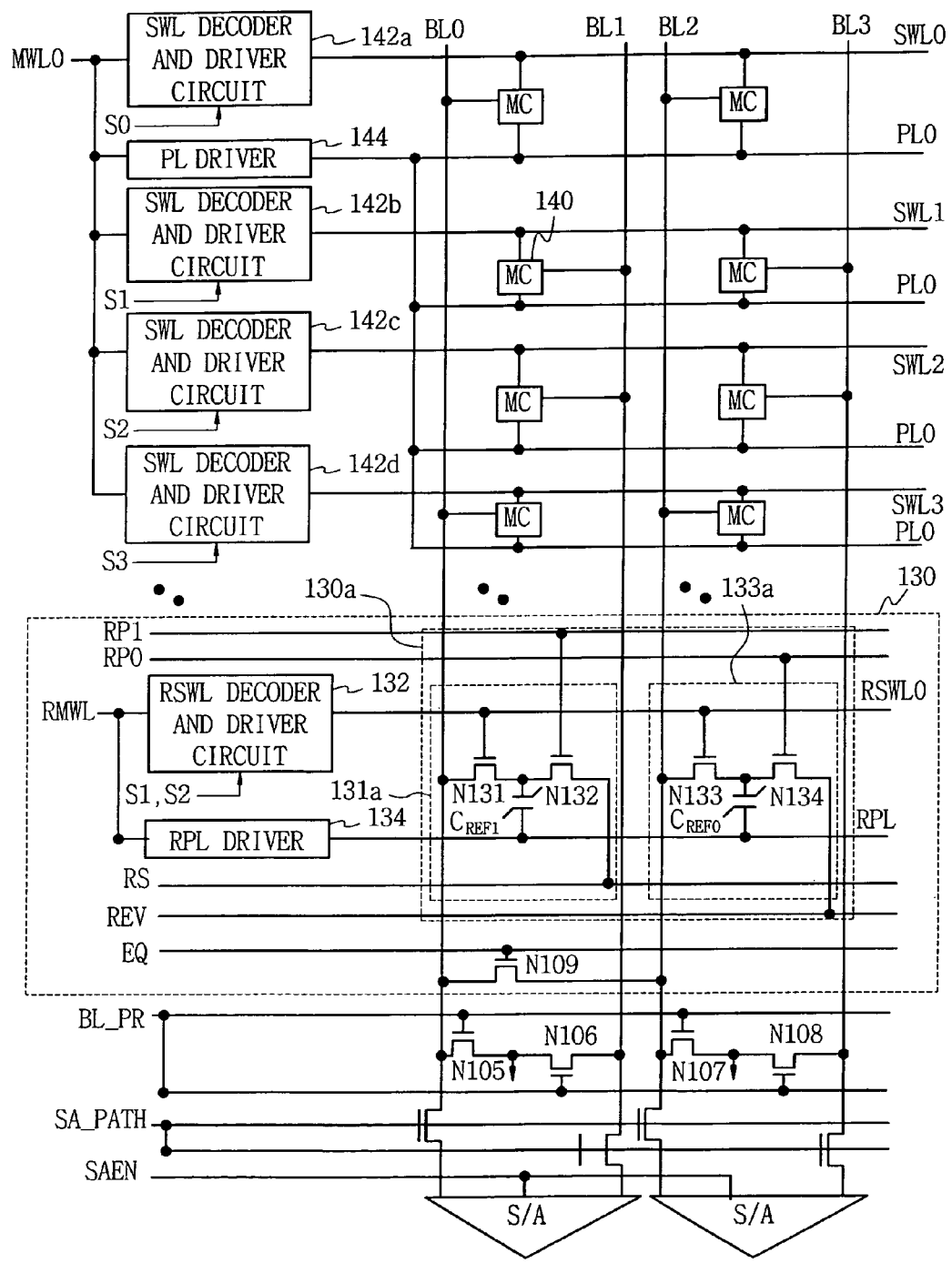
FIG. 9 is a block diagram of a ferroelectric memory device having a reference voltage supply apparatus that employs a non-switching capacitance and a switching capacitance according to an exemplary embodiment of the invention.

FIG. 9 is a block diagram of a ferroelectric memory device having a reference voltage supply apparatus that employs a non-switching capacitance and a switching capacitance according to an exemplary embodiment of the invention.

As shown in FIG. 9, the ferroelectric memory device having a reference voltage supply apparatus includes a main memory cell array having a plurality of ferroelectric memory cells MC, a reference voltage supply apparatus 130, and sense amplifiers S/A.

The main memory cell array is constructed of memory cells that have the same structure as that of the conventional ferroelectric memory cell of FIG. 2. The respective memory cells constructed of one ferroelectric capacitor and one access transistor are arrayed at intersections of rows and columns. The access switch (transistor) of each memory cell is connected to one word line (e.g., SWL0, SWL1, SWL2 or SWL3). One end (terminal) of the ferroelectric capacitor of each memory cell is connected to a plate line PL0, and another end (terminal) thereof is connected with one bit line (e.g., BL0, BL1, BL2, or BL3) through its respective access switch (transistor).

The word lines SWL0, SWL1, SWL2 and SWL3 are connected with respective word line decoder and driver circuits 142a, 142b, 142c and 142d for detecting word line selection signals S0, S1, S2 and S3 and for enabling word lines. The word line decoder and driver circuits 142a, 142b, 142c and 142d receive word line selection signals S0, S1, S2 and S3 through main word line signal MWL0. The plate lines PL0 are commonly connected to a plate line driver circuit 144 for providing plate line voltage to the plate lines PL0 in response to a plate enable signal.

The reference voltage supply apparatus 130 (a reference voltage controller that provides a reference voltage) includes a reference cell array, a reference word line decoder and driver circuit 132 for providing a reference word line enable signal to a reference word line RSWL0, and a reference plate line driver 134 for providing a reference plate line enable signal to a reference plate line RPL. The reference voltage supply apparatus 130 also includes circuits for generating various kinds of control signals RP0, RP1, RS, REV and EQ.

The reference cell array 130a is constructed of reference cells (e.g., 131a and 133a) that have a structure the same structure as or similar to that of the main memory cells MC (e.g., 140) and that are arrayed at intersections of rows and columns. Herewith reference cells in the reference cell array 130a connected with the bit lines BL1 and BL3 are not shown in the drawings.

The reference cell array 130a includes a first reference cell 133a and a second reference cell 131a. The first reference cell 133a is constructed of one ferroelectric capacitor $C_{REF0}$, one access switch (access transistor N133) and one control switch (control transistor N134), and provides a voltage corresponding to a non-switching capacitance to bit line BL2. The second reference cell 131a is constructed of one ferroelectric capacitor $C_{REF1}$, one access switch (access transistor N31) and one control switch (control transistor N32) and provides a voltage corresponding to a switching capacitance to bit line BL0.

Respective ferroelectric capacitors $C_{REF1}$, $C_{REF0}$ and respective access transistors N131, N133 of the first reference cell 133a and the second reference cell 131a respectively have a structure the same as or similar to that of ferroelectric main memory cell MC, and are connected to reference word line RSWL0 and reference plate line RPL. Thus, each access transistor N131, N133 is connected to reference word line RSWL0, and one end of ferroelectric capacitor of each reference cell RC is connected to reference plate line RPL, and another end thereof is connected to bit line BL0, BL2 through an access transistor.

The control transistors N134 and N132 are controlled by control signals RP0 and RP1, respectively. The control transistor N134 of the first reference cell 133a is connected between one terminal of the ferroelectric capacitor $C_{REF0}$ of the reference cell 133a(the other terminal of which is connected to the reference plate line RPL) and a line to which the control signal REV is applied. The control transistor N132 of the second reference cell 131a is connected between one terminal of the ferroelectric capacitor $C_{REF1}$ (the other terminal of which is connected to the reference plate line RPL) and a line to which the control signal RS is applied.

The reference word line decoder and driver circuit 132 is connected to the reference word line RSWL0, and enables reference word lines selected by a reference main word line signal RMWL and by a word line selection signal S1, S2. For example, when reference main word line signal RMWL is applied in "H" and a word line selection signal S1, S2 is selected, the reference word line decoder and driver circuit 132 enables reference word line RSWL0.

The reference plate line driver circuit 134 provides a reference plate line enable signal having a predetermined level to the reference plate line RPL in response to a reference plate line driver enable signal.

The control signal EQ controls a control transistor N109, to obtain a mean (averaged) value of two reference voltages provided from the reference cells 131a and 133a through the bit lines BL0 and BL2 and provide the mean (averaged) reference voltage to the sense amplifiers S/A.

The reference voltage controller 130 controls a first reference cell 133a that provides, as a first reference voltage, a voltage corresponding to a non-switching capacitance as data of first logic state, and a second reference cell 131a that stores data of second logic state opposite to the first logic state and that provides, as a second reference voltage, a voltage corresponding to a switching capacitance. In other words, in a state that data of second logic state is stored in the second reference cell 131a, data of the first logic state is stored at the first reference cell 133a and then a mean value of the first and second reference voltages is supplied as a reference voltage to the sense amplifiers S/A, in an active mode; and in a stand-by mode, data of the second logic state is stored at the first reference cell 133a and data of first logic state is stored in the second reference cell 131a.

The sense amplifiers S/A are connected to corresponding bit lines BL0, BL1, BL2 and BL3 that are commonly connected with the main memory cells MC and with the reference cells. The sense amplifiers compare a bit line voltage level connected to the main memory cell with a reference bit line voltage level connected to the reference cell(s), and sense it, then read out data of the selected main memory cell. The sense amplifiers S/A are switchably connected to the bit lines through NMOS transistors for connecting the sense amplifiers to the bit lines in response to a sense amplifier path signal SA_PATH.

Additionally, transistors N105, N106, N107 and N108 are provided for precharging the bit lines BL0, BL1, BL2 and BL3 in response to bit line precharge signals BL_PR and RBL_PR.

Figure 10:
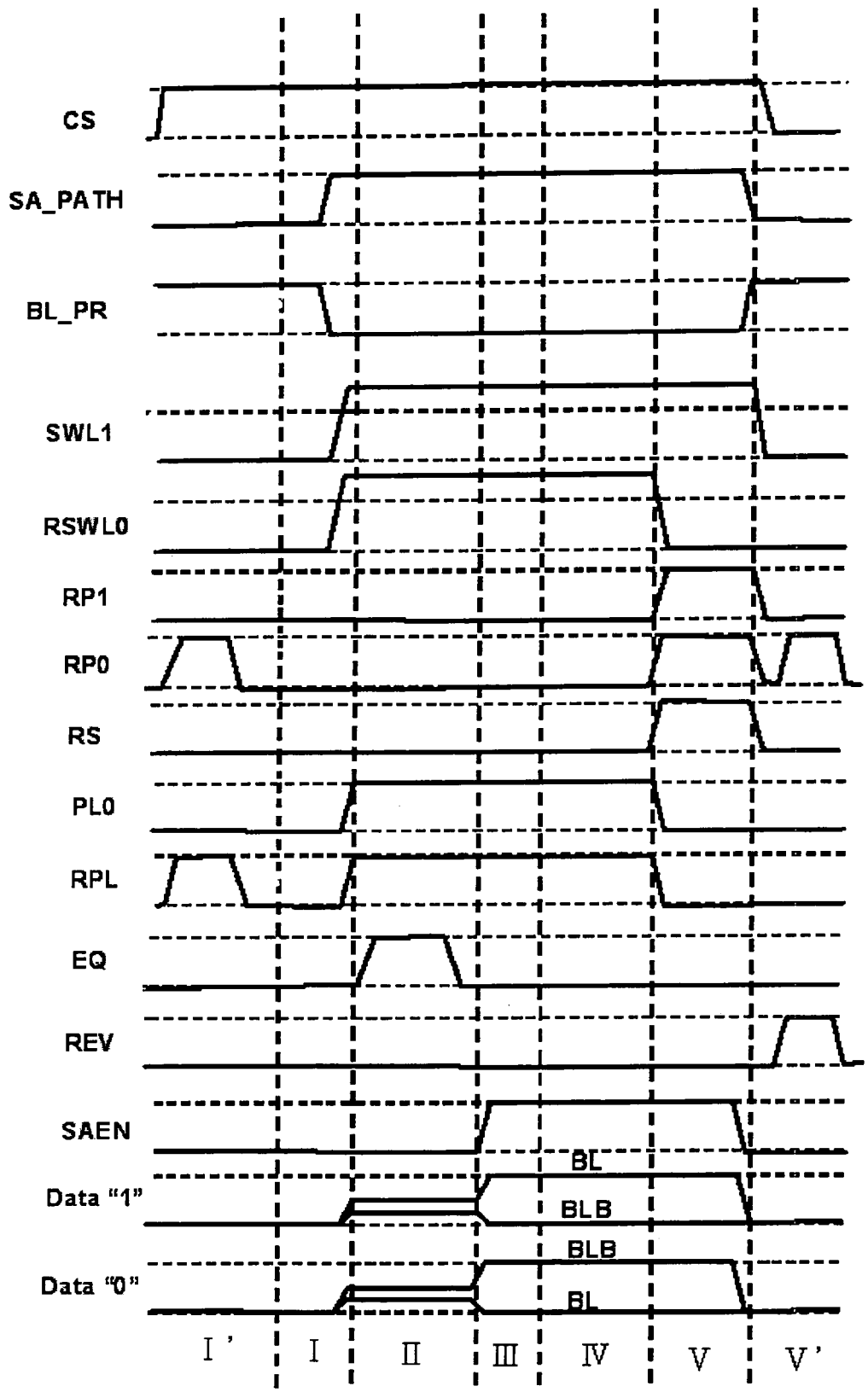
FIG. 10 is a timing diagram illustrates timing of a read operation of the memory device of FIG. 9.

FIG. 10 is a timing diagram illustrating the timing of read operation for data of a main memory cell in the ferroelectric memory device referred to in FIG. 9.

Read operation for data stored in a memory cell 140 connected to a bit line BL1 of FIG. 9 will be described section by section, as follows. For explanatory convenience, the bit line BL1 connected to the memory cell 140 is called a main bit line BL, and bit lines BL0 and BL2 connected to reference cells 131a and 133a are called sub-bit line(s) BLB.

As shown in FIGS. 9 and 10, in a stand-by mode (before an enabling of a chip selector signal), a precharge signal BL_PR of the main bit line BL connected to memory cell 140 and the sub-bit lines BLB connected to the reference cell 133a and 121a are enabled to precharge the bit lines BL and BLB.

At section I' a chip selector signal CS is enabled and an active mode starts to store data of a first logic state in the first reference cell 133a. A control signal RP0 is enabled such that the main bit line BL and the sub-bit lines BLB are precharged, and a reference plate line is enabled. After a lapse of predetermined time, the control signal RP0 and a reference plate line RPL are disabled, thus storing data of the first logic state in (the ferroelectric capacitor of) the first reference cell 133a.

The operation of storing data of the first logic state in the first reference cell 133a can be performed by such various other methods as pulsing a bit line, etc. Further, the storage of data of the first logic state in the first reference cell 133a, can be performed once only when a selected memory block of a reference cell array is changed.

Figure 5:
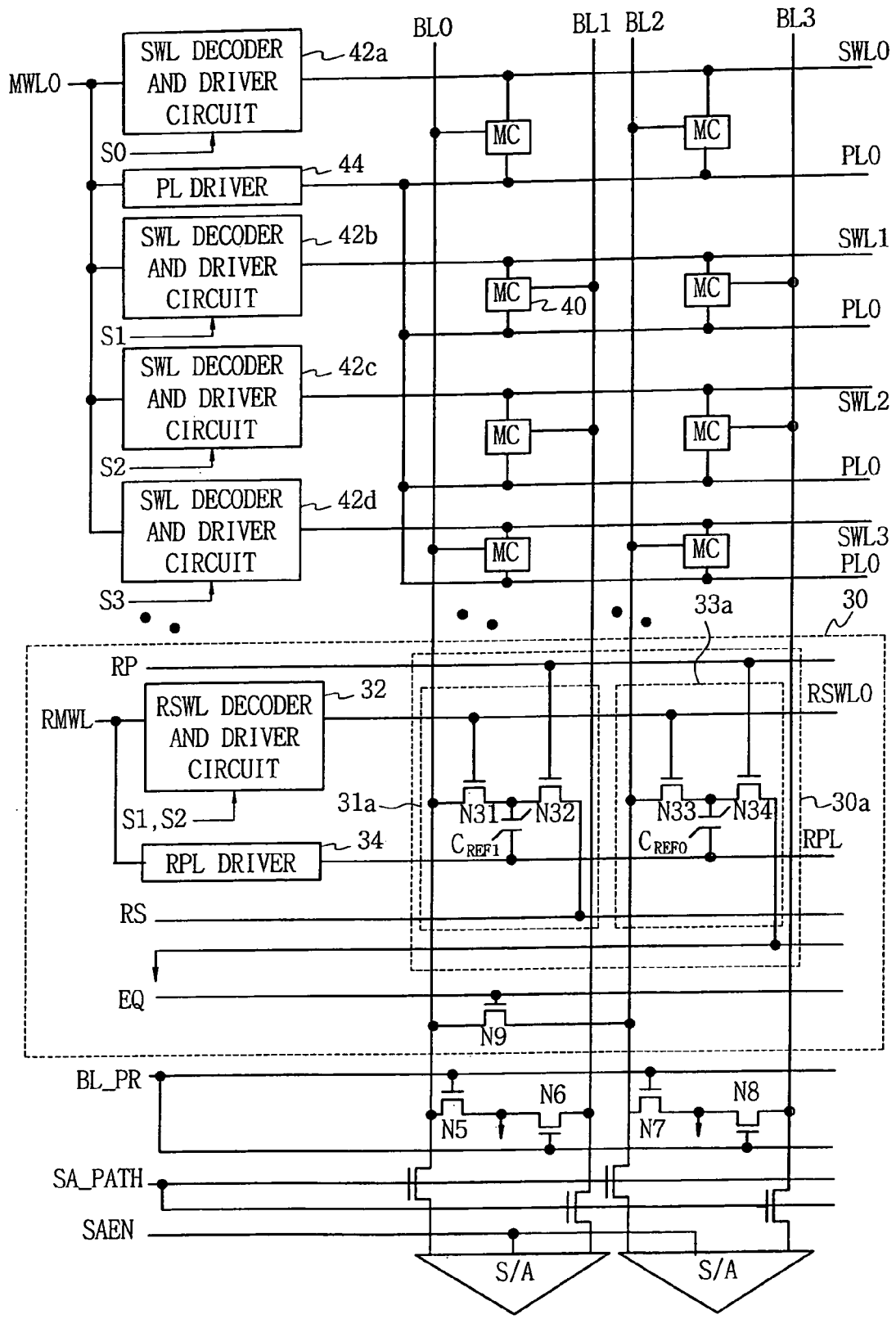
FIG. 5 is a block diagram of a ferroelectric memory device having a reference voltage supply apparatus that employs a non-switching capacitance and a switching capacitance according to the prior art.
Figure 6:
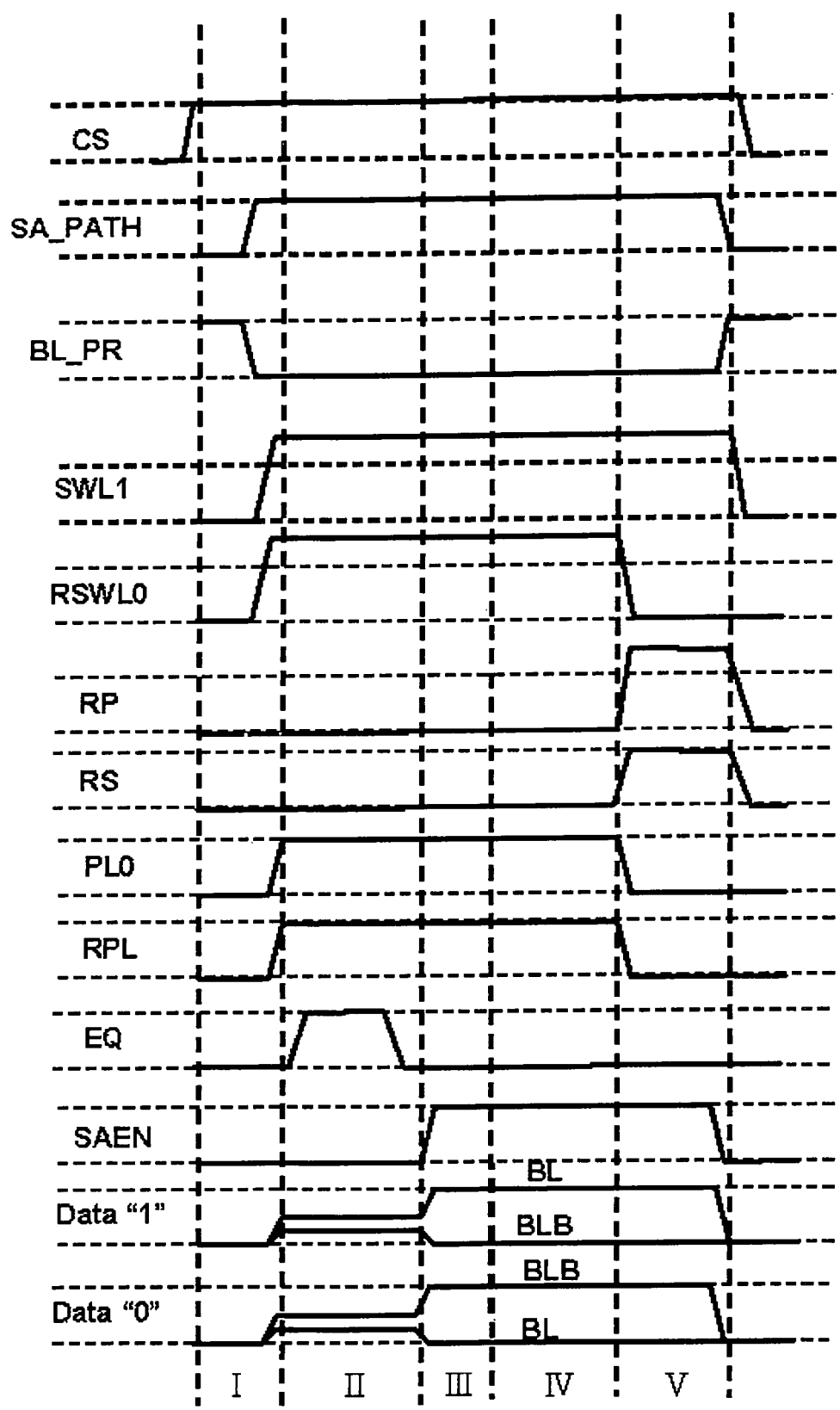
FIG. 6 is a timing diagram illustrating the timing of operations of the device of FIG. 5.

At section "I", a read operation starts like in the conventional device of FIG. 5. A bit line precharge signal BL_PR is disabled and simultaneously a sense amplifier path signal SA_PATH is enabled, and so the bit lines BL and BLB and the sense amplifier S/A are electrically connected. A main word line signal MWL0 and a word line selection signal S1 are enabled and applied, thus a word line SWL1 is selected and enabled by a word line decoder and driver circuit 142b. The reference word line decoder and driver circuit 132 is selected by the word line selection signal S1, to enable reference word line RSWL0.

At section "II", a plate line PL0 and a reference plate line RPL are enabled to a voltage having a predetermined level. A voltage of data "1" or data "0" corresponding to data stored in a selected main memory cell 140 is passed to the main bit line BL, and reference voltage is provided to the sub-bit lines BLB connected to reference cells 133a and 130a. A first reference voltage corresponding to a non-switching capacitance, provided from the first reference cell 133a, is provided to sub-bit line BL2, and a second reference voltage corresponding to a switching capacitance, provided from the second reference cell 131a, is provided to sub-bit line BL0. When the two reference voltages are provided to the sub-bit lines BLB, a control signal EQ is enabled, to operate the control transistor N109 and thus generate and supply a mean (averaged) value of respective reference voltages provided to bit lines BL0 and BL2 (sub-bit lines BLB), to the sub-bit line BLB. Then, the control signal EQ is disabled.

At sections "III" and "IV", the sense amplifier S/A is driven by a sense amplifier enable signal SAEN, and data of the memory cell 140 is sensed and amplified based on the (mean, averaged) reference voltage. When data "0" is sensed by an amplification reaction of the sense amplifier S/A, the voltage of the main bit line BL becomes a ground voltage, and voltage of the sub-bit line BLB has the level of power supply voltage. When data "1" is sensed, the voltage of the main bit line BL becomes the level of power supply voltage, and voltage of the sub-bit line BLB becomes the level of a ground voltage.

At a section "V", the reference plate line RPL and the plate line PL0 are disabled, then a word line SWL1 is disabled after a lapse of predetermined time, and so that original data of the memory cell 140 is returned (rewritten) to the memory cell 140. Further, the reference word line RSWL0 is disabled and control signals RP0 and RP1 are enabled, to drive the control transistors N132 and N134, and a control signal RS is enabled in a state that a control signal REV is maintained under a disable state. The control signals RP0, RP1 and RS are again disabled after lapse of predetermined time, thus data of a first logic state corresponding to a non-switching capacitance is maintained in the first reference cell 133a, and data of a second logic state corresponding to a switching capacitance is maintained in the second reference cell 131a. Then, the word line SWL1 is disabled and simultaneously a bit line precharge signal BL_PR is enabled and a sense amplifier enable signal SAEN is disabled. Thereby, operation in the active mode is performed.

At the section "V" the chip selector signal is disabled, thus a stand-by mode starts. When the stand-by mode starts, control signal RP0 is enabled and control signal REV is enabled, and then the signals are again disabled after lapse of a predetermined time, so as to store data of second logic state in the first reference cell 133a (and so as to store data of first logic state in the second reference cell 131a).

Figure 1:
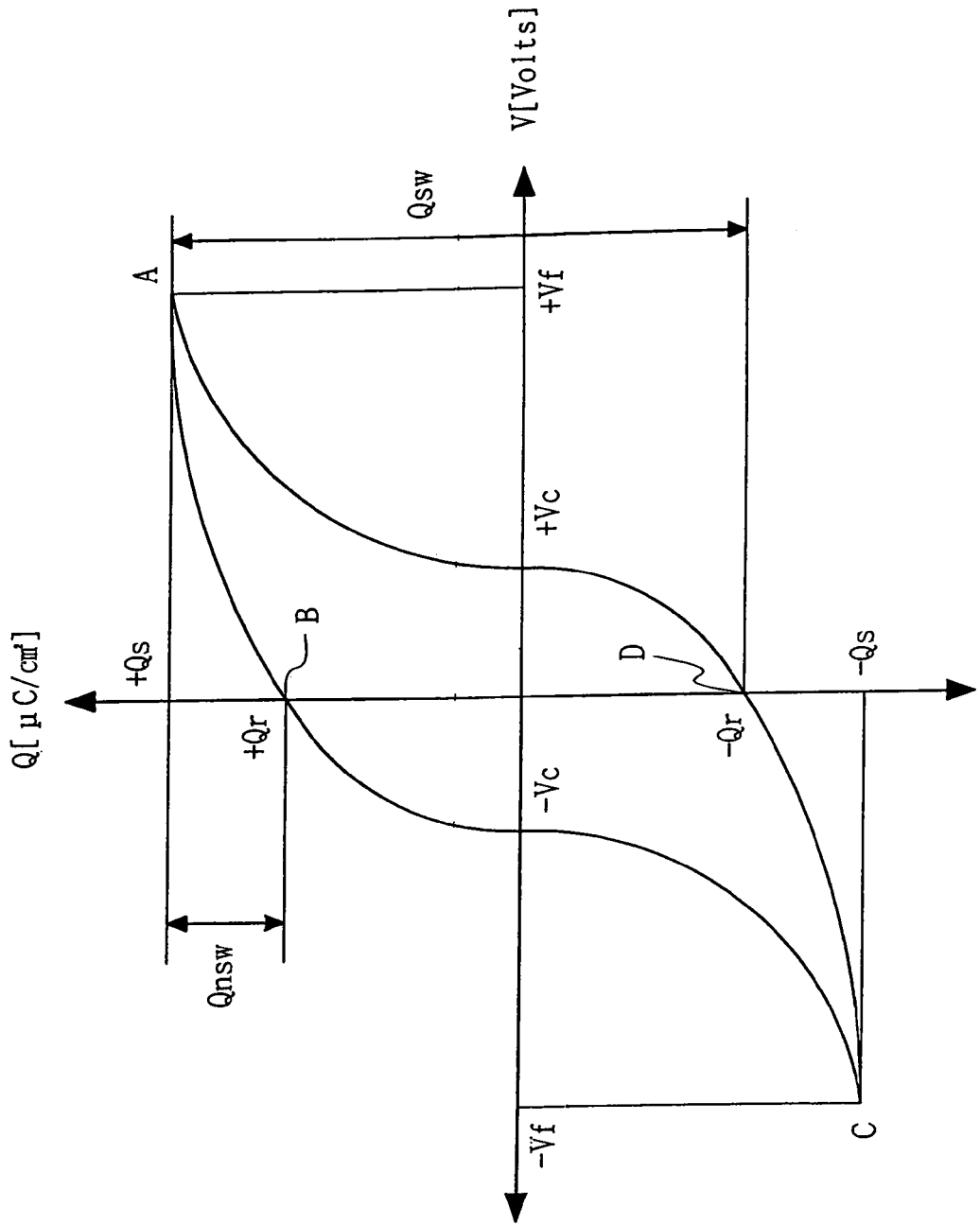
FIG. 1. illustrates a typical hysteresis curve for ferroelectric materials according to the prior art.

Thus, a read operation of the ferroelectric memory device shown in FIG. 9 is completed. In the reference voltage supply apparatus of the semiconductor memory device, a uniform polarization state of ferroelectric capacitor of the first reference cell using a non-switching capacitance is prevented from being maintained for a long time, thus preventing or substantially reducing an imprint effect upon the ferroelectric capacitor and providing a stabilized reference voltage. According to an exemplary embodiment of the invention it is described above that data "0" corresponds to a state point B of a hysteresis loop shown in FIG. 1 and data "1" corresponds to a state point D. But, it can be simply applied by those skilled in the art that in the invention, data "1" corresponds to the state point B and data "0" corresponds to the state point D. Further, according to an exemplary embodiment of the invention, it is described above that a reference voltage supply apparatus and a driving method thereof are applied to a ferroelectric memory device, but embodiments of the invention can be applied to a DRAM or other semiconductor memory device.

While the present invention has been particularly shown and described with reference to exemplary embodiments thereof, it will be understood by those skilled in the art that various changes in form and details may be made therein without departing from the spirit and scope of the present invention as defined by the appended claims.

For example, internal configuration of the circuit may be varied or internal elements of the circuit may be replaced with other equivalent elements, or their logical complements. Accordingly, these and other changes and modifications are seen to be within the true spirit and scope of the invention as defined by the appended claims.

What is claimed is:

1. An apparatus for providing a reference voltage for reading data stored in a ferroelectric memory cell, the apparatus comprising:
a set of reference cells, including a ferroelectric capacitor and an access switch, for storing data of a first logic state as a reference voltage during an active mode that occurs after the ferroelectric memory cell is selected to be read; and
a reference voltage controller for writing data of a second logic state opposite to the first logic state, into the set of reference cells, in a stand-by mode that occurs before the ferroelectric memory cell is selected to be reads,
wherein the set of reference cells include a first reference cell for providing a voltage corresponding to a non-switching capacitance, the first reference cell receiving a first control signal at a gate of a first control transistor and receiving a reference word line enable signal at a first access transistor, and a second reference cell for providing a voltage corresponding to a switching capacitance, the second reference cell receiving a second control signal at a gate of a second control switch transistor and receiving the reference word line enable signal at a second access transistor,
wherein the first control transistor and the first access transistor are connected to one terminal of the first reference cell and the second control switch transistor and the second access transistor are connected to one terminal of the second reference cell and wherein the first control signal, received at the gate of the first control transistor, and the second control signal, received at the gate of the second control switch transistor, are independent.

2. The apparatus of claim 1, wherein the data of the first logic state corresponds to the non-switching region capacitance of the ferroelectric capacitor of the set of reference cells.

3. The apparatus of claim 1, further comprising:
a reference word line for controlling the access switch of the set of reference cells;
a reference plate line connected to one terminal of the ferroelectric capacitor of the set of reference; and
a bit line connected to the set of reference cells for passing the reference voltage corresponding to data stored in the set of reference cells.

4. The apparatus of claim 3, wherein the reference voltage controller comprises:
- a reference word line decoder and driver circuit for controlling the set of reference cells through the reference word line; and
- a reference plate line driver circuit for controlling the set of reference cells through the reference plate line.

5. The apparatus of claim 4, wherein the ferroelectric capacitor of the set of reference cells is connected between the access switch and the reference plate line, and the access switch is connected between the ferroelectric capacitor and the bit line.

6. The apparatus of claim 1, wherein the reference voltage supplied from the set of reference cells is passed to the bit line connected to the set of reference cells, and the data voltage supplied from the memory cell is passed to a bit line connected to the memory cell through an access switch of the memory cell.

7. A reference voltage supply apparatus for providing a mean value of non-switching region capacitance and switching region capacitance of a ferroelectric capacitor, as a reference voltage, to read data of a memory cell, the apparatus comprising:
- a first reference cell for providing a voltage corresponding to first logic state, as a first reference voltage, during an active mode that occurs after the ferroelectric capacitor is selected to be read;
- a second reference cell for storing data of a second logic state, opposite to the first logic state as a second reference voltage during the active mode; and
- a reference voltage controller adapted to write data of the second logic state into the first reference cell in a stand-by mode that occurs before the ferroelectric memory cell is selected to be read, wherein the first reference cell receives a first control signal at a gate of a first control transistor and receives a reference word line enable signal at a first access transistor, and the second reference cell receives a second control signal at a gate of a second control switch transistor and receives the reference word line enable signal at a second access transistor,
- wherein the first control transistor and the first access transistor are connected to one terminal of the first reference cell and the second control switch transistor and the second access transistor are connected to one terminal of the second reference cell and wherein the first control signal, received at the gate of the first control transistor, and the second control signal, received at the gate of the second control switch transistor, are independent.

8. The apparatus of claim 7, wherein the reference voltage controller provides a mean value of the first and second reference voltages as a reference voltage in an active mode.

9. The apparatus of claim 8, wherein the reference voltage controller is further adapted to write data of the first logic state into the second reference cell in the stand-by mode.

10. The apparatus of claim 7, wherein the first logic state corresponds to a non-switching capacitance.

11. The apparatus of claim 7, further comprising:
- a reference word line for controlling access switches constituting the reference cell;
- a reference plate line connected to each one terminal of ferroelectric capacitors constituting the reference cell; and
- bit lines to-which the first and second reference voltages are passed.

12. The apparatus of claim 11, wherein the reference voltage controller comprises:
- a reference word line decoder and driver circuit for controlling the first and second reference cells through the reference word line; and
- a reference plate line driver circuit for controlling the first and second reference cells through the reference plate line.

13. The apparatus of claim 12, wherein the first reference cell at least includes one ferroelectric capacitor and one access switch, and the second reference cell includes at least one ferroelectric capacitor and one access switch.

14. The apparatus of claim 13, wherein the first reference voltage supplied from the first reference cell is passed to a bit line connected to the first reference cell, and a data voltage from the memory cell is passed to a bit line connected to the memory cell.

* * * * *